United States Patent
Mizuta

[11] Patent Number: 6,156,635
[45] Date of Patent: Dec. 5, 2000

[54] METHOD OF CORRECTING SOLDER BUMPS

[75] Inventor: Masaharu Mizuta, Hyogo, Japan

[73] Assignee: Mitsubishi Denki Kabushiki Kaisha, Tokyo, Japan

[21] Appl. No.: 09/126,735

[22] Filed: Jul. 31, 1998

[30] Foreign Application Priority Data

Feb. 17, 1998 [JP] Japan .................................. 10-034505

[51] Int. Cl.⁷ .................................................. H01L 21/44
[52] U.S. Cl. ............................................. 438/612; 438/613
[58] Field of Search ..................................... 438/612, 613

[56] References Cited

U.S. PATENT DOCUMENTS

| | | | |
|---|---|---|---|
| 5,289,631 | 3/1994 | Koopman et al. | 29/840 |
| 5,684,330 | 11/1997 | Lee | 257/692 |
| 5,686,353 | 11/1997 | Yagi et al. | 438/15 |
| 5,765,744 | 6/1998 | Tatumi et al. | 228/254 |
| 5,872,051 | 2/1995 | Fallon et al. | 438/616 |

FOREIGN PATENT DOCUMENTS 63-117450  5/1988  Japan .
1-281756  11/1989  Japan .

Primary Examiner—Richard Elms
Assistant Examiner—Christian D. Wilson
Attorney, Agent, or Firm—McDermott, Will & Emery

[57] ABSTRACT

An IC substrate provided with a plurality of solder bumps is prepared. Flux is applied to solder bumps. Solder bumps are heated for melting. Solder bumps are pressed against a heating portion having a flat surface. Solder bumps are cooled. An improved method of correcting solder bumps, which permits good soldering is provided.

9 Claims, 3 Drawing Sheets

FIG. 5
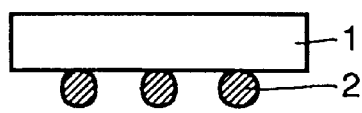
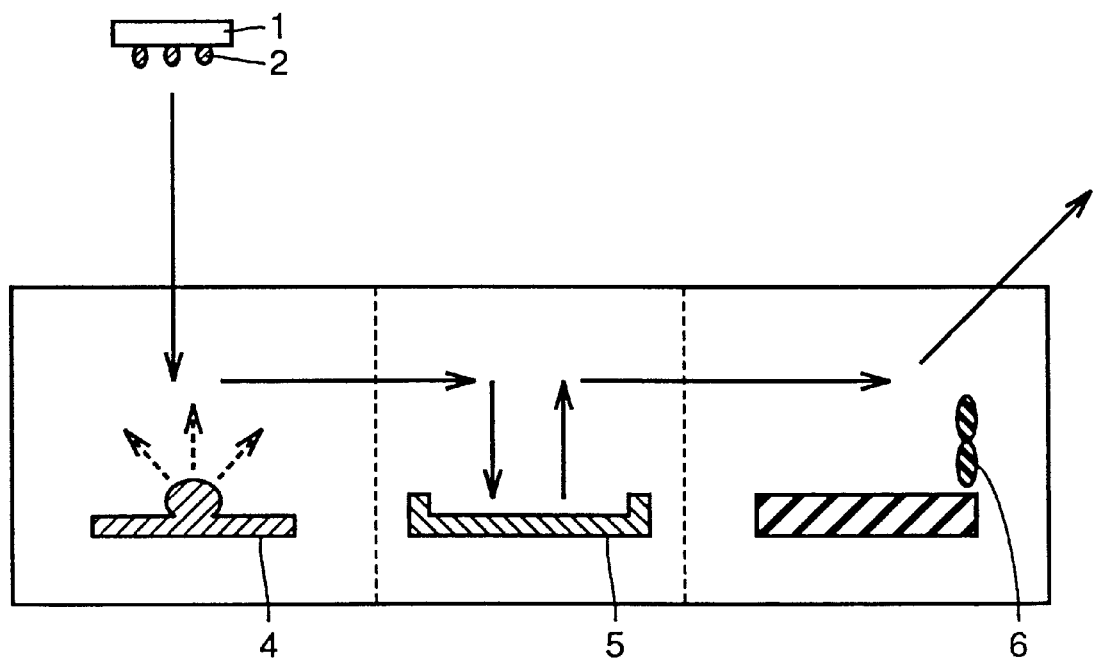
FIG. 6A   FIG. 6B   FIG. 6C

METHOD OF CORRECTING SOLDER BUMPS

BACKGROUND OF THE INVENTION

1. Field of the Invention

The present invention relates generally to methods of correcting solder bumps, and more particularly, to an improved method of correcting solder bumps, which permits better soldering.

2. Description of the Background Art

Recent mobile instruments more often employ ICs having a Chip Scale Package (CSP) in the closest possible size to the outer shape of an IC (Integrated Circuit) chip or ICs of a Ball Grid Array (BGA) type. These types of ICs will be probably more often used for their applicability to compact, light-weight and thin electronics. When these kinds of ICs are actually mounted on a printed circuit board, solder bumps provided at a part of an IC are abutted against the printed circuit board at prescribed positions for reflow of the solder bumps. The IC and the printed circuit board are thus soldered.

FIGS. 7A and 7B show how a CSP type IC is soldered to a printed circuit board.

FIG. 7A is a cross section of the CSP type IC before reflow. An IC substrate 1 is provided with solder bumps 2. FIG. 7B shows the state after solder bumps 2 are abutted against printed circuit board 3 and reflowed. Solder bumps 2 are virtually fixed to printed circuit board 3 by the adhesive force of flux applied on the conductor portion of printed circuit board 3. Heat during the reflow allows solder bumps 2 to melt, and IC substrate 1 and printed circuit board 3 are joined accordingly.

In order to perform good soldering, a number of solder bumps 2 must be in contact with printed circuit board 3 at a time. In order to solder a number of solder bumps 2 to printed circuit board 3, variation in the height of solder bumps 2 should be generally 50 μm or lower.

SUMMARY OF THE INVENTION

FIGS. 8A to 8C are views showing more in detail the process of manufacturing a CSP type IC.

In the process of manufacturing a CSP type IC includes test and burn-in steps. In any of the steps, a contact pin is contacted to the solder bumps 2 of an IC, and then an electrical signal is applied for testing or burn-in. In such a testing, the temperature is 25° C. (room temperature) or 80° C. (high temperature). In the burn-in, the temperature is 125° C.

FIG. 8A shows an IC before testing.

Referring to FIG. 8B, when a contact pin is contacted to solder bumps 2 for testing, the contact pin (not shown) is contacted to solder bumps 2 and then a prescribed force is imposed on the contact pin. Thus, solder bumps 2 are rubbed against or partly cut off to remove an oxide film (or a similar substance) on the surface, so that good electrical contact is available. Referring to FIG. 8B, if solder bumps 2 are exposed to a high temperature atmosphere at the time, solder bumps 2 could be damaged or recessed. Solder used for solder bumps 2 such as so-called eutectic solder is essentially soft and becomes even softer at a high temperature, and therefore damages, recesses and deformation may be caused as shown in FIG. 8B. Such deformation of solder bumps 2 when the contact pin contacts the bumps is unavoidable in the test and burn-in steps.

Solder bumps in a CSP particularly deforms during a high temperature burn-in. According to a conventional method, if the variation in the height of solder bumps 2 is without the tolerance, solder faults are generated as shown in FIG. 8C, and connection faults could be caused between IC substrate 1 and printed circuit board 3.

It is therefore an object of the present invention to provide an improved method of correcting solder bumps, according to which solder bumps deformed by a test and a burn-in are returned to their initial normal shapes and good soldering is permitted.

It is another object of the invention to provide an improved method of correcting solder bumps by restricting the variation in the height of solder bumps deformed by a test and a burn-in within a tolerance, which permits good soldering.

In a method of correcting solder bumps according to a first aspect of the invention, an IC substrate provided with a plurality of solder bumps is prepared (the first step). The solder bumps are coated with flux (the second step). The solder bumps are allowed to melt by heating (the third step). The plurality of solder bumps are then abutted against a heating portion having a flat surface (the fourth step). The solder bumps are cooled (the fifth step).

According to the method of correcting solder bumps according to the first aspect of the invention, the solder bumps are allowed to melt by heating and then abutted against the heating portion having a flat surface, and therefore damages and deformation such as recesses in the solder bumps are reduced so that the solder bumps are returned to almost to the original shapes.

According to a second aspect of the invention, the heating portion has a cooling function, and the above fourth and fifth steps are performed at a time.

According to the second aspect of the invention, since the fourth and fifth steps are performed at a time, time required for correcting solder bumps may be reduced.

By a method of correcting solder bumps according to a third aspect of the invention, the IC substrate includes a chip scale package type IC substrate.

According to the third aspect of the invention, in a chip scale package type IC, the shape of solder bumps is returned to the original shape, which permits good soldering.

By a method of correcting solder bumps according to a fourth aspect of the invention, the IC substrate includes a ball grid array type IC substrate.

By the method of correcting solder bumps according to the fourth aspect of the invention, in a ball grid array type IC substrate, solder bumps are returned to initial normal shapes, which permits good soldering.

By the method of correcting solder bumps according to a fifth aspect of the invention, the heating portion includes a hot plate.

By the method of correcting solder bumps according to the fifth aspect of the invention, the heating portion may be formed by a general purpose device.

By a method of correcting solder bumps according to a sixth aspect of the invention, the solder bumps are pressed against the heating portion from the bottom side.

By a method of correcting solder bumps according to a seventh aspect of the invention, the solder bumps are pressed against the heating portion from the upper side.

By a method of correcting solder bumps according to an eighth aspect of the invention, the first to fifth steps are performed after testing said IC substrate.

By the method of correcting solder bumps according to the eighth aspect of the invention, since the first to fifth steps are performed after testing the IC substrate, the shape of solder bumps deformed after testing may be returned to the original shape.

By a method of correcting solder bumps according to a ninth aspect of the invention, the first to fifth steps are performed after a burn-in step for the IC substrate.

By the method of correcting solder bumps according to the ninth aspect of the invention, the first to fifth steps are performed after the burn-in step for the IC substrate, damages, recesses or the like caused in the burn-in step are reformed, and the shape of the bumps may be returned almost to the original shape.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 2 to 5 are the first to fourth steps in the method of correcting solder bumps according to the embodiment of the invention;

FIGS. 6A to 6C are concept views showing a device for implementing the method of correcting solder bumps according to the embodiment;

DESCRIPTION OF THE PREFERRED EMBODIMENT

Figure 1:
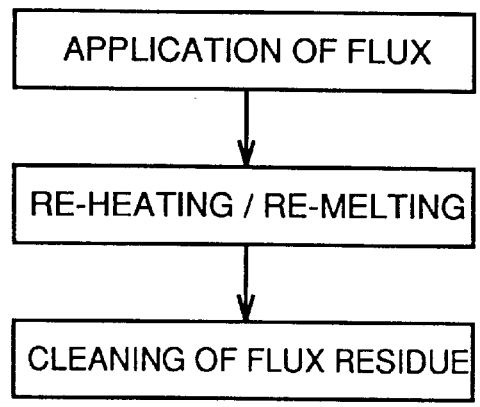
FIG. 1 is a flow chart for use in illustration of a method of correcting solder bumps according to an embodiment of the invention.
Figure 2:

An embodiment of the present invention will be now described in conjunction with the accompanying drawings.

A method of correcting solder bumps according to an embodiment of the invention includes the steps of applying flux, re-heating/re-melting, and cleaning flux residue. Before testing or burn-in of an IC, solder bumps have an initial normal shape and variation in the height of all the solder bumps is within the tolerance.

After the step of testing or burn-in of the IC, solder bumps deform as described above, and the variation in the height, an important condition for soldering, is often without the tolerance.

Oxidized and deformed solder is less likely to be returned to the original normal shape if re-melted. If, however, flux is applied, solder bumps may be returned to almost the original shape by heating and re-melting the solder bumps thereby reducing damages or recesses. Flux may readily applied directly to the solder bumps by a spraying method.

The method of correcting solder bumps according to the embodiment will be further described.

FIGS. 2 to 5 are views showing main steps in the method of correcting solder bumps according to the embodiment. FIG. 6 is a concept view of a device for implementing the method of correcting solder bumps according to the embodiment.

Before describing the steps shown in FIGS. 2 to 5, a correction device for solder bumps shown in FIGS. 6A to 6B will be described.

The correction device includes a re-heating portion (FIG. 6A), a re-melting portion (FIG. 6B), and a cooling portion (FIG. 6C). The re-heating portion is provided with a heater 4 for heating solder bumps to the vicinity of the melting point of the solder. The re-melting portion is provided with a hot plate 5 having a flat surface heated up to the vicinity of the melting point of solder. The cooling portion is provided with a cooler 6 including a fan for supplying cooling air to the solder bumps.

Referring back to FIG. 2, an IC substrate after testing or burn-in is prepared. The solder bumps 2 have damages or recesses. Solder bumps 2 are applied with flux (not shown). Then, IC substrate 1 is fed into the re-heating portion in the correction device shown in FIGS. 6A to 6C, and the solder bumps are re-heated/re-melted. A halogen heater is preferably used for heater 4 for re-heating/re-melting the solder bumps.

Figure 3:
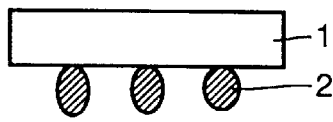
Figure 4:
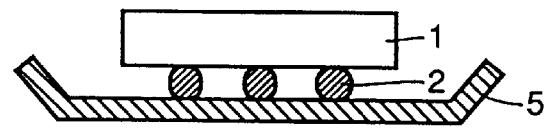
Figure 7A:
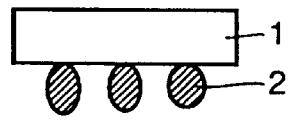
FIGS. 7A and 7B show how a conventional IC is soldered to a printed circuit board.
Figure 7B:
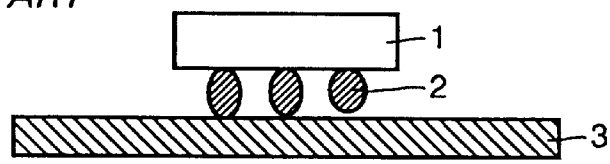
Figure 8A:
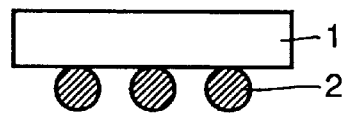
FIGS. 8A to 8C show problems associated with conventional soldering.
Figure 8B:
Figure 8C:
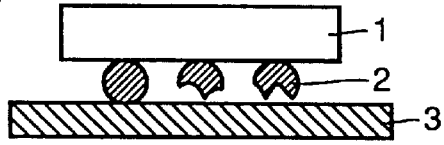

Referring to FIG. 3, deformations such as damages or recesses generated in solder bumps 2 at the time of contact are reduced by re-heating/re-melting of solder bumps 2, and solder bumps 2 are in a shape having a suspended elliptical cross section (hereinafter "football shape") as shown. There still exists a variation in the height of solder bumps 2 after the correction simply by re-heating of solder bumps 2, and good soldering cannot be expected. Therefore, connection faults are still highly probable.

Referring to FIGS. 4 and 6A to 6C, IC substrate 1 having football shaped solder bumps 2 is fed into the re-melting portion (FIG. 6B), and pressed against heated hot plate 5 having a flat surface, which has been Teflon-coated or fluoro-coated. Thus, the variation in the height of solder bumps 2 is minimized. Hence, the reliability of the connection between IC substrate 1 and the printed circuit board is improved. Football shaped solder bumps 2 having a variation in the height are pressed against the flat surface of hot plate 5, and attain a crashed sphere-like shape. However, the heights of all the solder bumps 2 are equalized, which permits good soldering.

Referring to FIGS. 5 and 6A to 6C, IC substrate 1 is fed into the cooling portion, cooling air is sent to solder bumps 2 from cooler 4, and the temperature of solder bumps 2 is lowered. If the temperature of solder bumps 2 is lowered, the shape is maintained.

Note that in the above-described embodiment of the invention, the re-melting portion and cooling portion are separately provided by way of illustration, but these portions may be formed as a single unit. More specifically, by providing both temperature raising and lowering functions to the temperature control of hot plate 5, they may be formed into a single unit.

According to the embodiment of the invention, variation in the height of solder bumps is restricted within the range which permits good soldering, and therefore the reliability of connection between the IC substrate and the printed circuit board is improved.

Although, in the above-described embodiment, the method of processing a single CSP type IC is described, the invention is not limited to this, and may be modified such that a number of ICs may be processed at a time.

Referring to FIGS. 6A to 6C, a CSP type IC is placed on hot plate 5 in the re-melting portion for re-melting, the invention is not limited to this. More specifically, if hot plate 5 is placed at the upper side, and a CSP type IC is pressed against the flat surface of hot plate 5 from the bottom side, the same effect is available.

Furthermore, in the above embodiment of the invention, the invention is applied to an IC substrate after testing or burn-in steps, the invention is not limited to this. More specifically, the invention is also applicable to solder bumps already having a variation in the height prior to the testing or burn-in steps. The variation in the height of solder bumps may be minimized, which permits good soldering.

As described above, according to the present invention, the variation in the height of solder bumps may be minimized, which advantageously permits good soldering.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of correcting damaged solder bumps, comprising:
    a first step of preparing an IC substrate provided with a plurality of solder bumps;
    a second step of applying flux to solder bumps containing damage;
    a third step of melting said solder bumps by heating;
    a fourth step of pressing said solder bumps against a heating portion having a flat surface; and
    a fifth step of cooling said solder bumps.

2. The method as recited in claim 1, wherein said heating portion is provided with a cooling function, and said fourth and fifth steps are simultaneously performed.

3. The method as recited in claim 1, wherein said IC substrate includes a chip scale package type IC substrate.

4. The method as recited in claim 1, wherein said IC substrate includes a ball grid array type IC substrate.

5. The method as recited in claim 1, wherein said heating portion includes a hot plate.

6. The method as recited in claim 1, wherein said solder bump is pressed against said heating portion from the bottom side.

7. The method as recited in claim 1, wherein said solder bumps are pressed against said heating portion from the upper side.

8. The method as recited in claim 1, wherein said first to fifth steps are performed after testing said IC substrate.

9. The method as recited in claim 1, wherein said first to fifth steps are performed after a burn-in step of said IC substrate.

* * * * *